United States Patent [19]

Iwahashi

[11] Patent Number: 5,603,105
[45] Date of Patent: Feb. 11, 1997

[54] BASEBAND SIGNAL PROCESSING CIRCUIT FOR A RADIO COMMUNICATION APPARATUS

[75] Inventor: Koji Iwahashi, Tokyo, Japan

[73] Assignee: NEC Corporation, Japan

[21] Appl. No.: 175,685

[22] Filed: Dec. 29, 1993

Related U.S. Application Data

[63] Continuation of Ser. No. 816,399, Dec. 27, 1991, abandoned.

[30] Foreign Application Priority Data

Dec. 29, 1990 [JP] Japan .................................. 2-418503

[51] Int. Cl.$^6$ .................................................. H04B 1/04
[52] U.S. Cl. ........................... 455/110; 455/114; 455/115
[58] Field of Search ...................................... 455/116, 115, 455/126, 127, 234.1, 250.1, 308, 309, 72; 332/125, 129, 155, 156, 159, 160–162; 328/168; 330/138, 129, 279, 280; 327/309, 310, 312, 306

[56] References Cited

U.S. PATENT DOCUMENTS

| | | | |
|---|---|---|---|
| 3,605,020 | 9/1971 | Sullivan ................................. | 455/116 |
| 3,800,237 | 3/1974 | Fletcher et al. ......................... | 328/168 |
| 3,991,370 | 11/1976 | Pate . | |
| 4,225,822 | 9/1980 | Kariatsumari ........................... | 455/108 |
| 4,491,972 | 1/1985 | Weber ..................................... | 455/116 |

FOREIGN PATENT DOCUMENTS

| | | | |
|---|---|---|---|
| 0394063 | 10/1990 | European Pat. Off. . | |
| 0009233 | 1/1988 | Japan ..................................... | 455/127 |

OTHER PUBLICATIONS

UKW–Berichte J21956 F, Heft Mar. 1974, Joachim Kestler: "SSB–Exciter mit HF–Clipper" pp. 154–167.

Primary Examiner—Reinhard J. Eisenzopf
Assistant Examiner—Nguyen Vo
Attorney, Agent, or Firm—Ostrolenk, Faber, Gerb & Soffen, LLP

[57] ABSTRACT

A baseband signal processing circuit for a radio communication apparatus has an amplifier for amplifying the amplitude of an input baseband signal, a limiter for limiting the amplitude of the amplified baseband signal, an amplitude detector for detecting the amplitude of the output signal of the amplifier, and a control unit for controlling the gain of the amplifier in response to the output of the amplitude detector. When the amplitude detector detects an amplitude greater than a predetermined level, the control unit controls the gain of the amplifier in such a manner as to maintain the output of the amplifier at a constant level. As a result, the output level of the amplifier is prevented from exceeding the limiter level of the limiter. This allows the maximum frequency transition to be set up with no regard to frequency and suppresses distortions regarding signals exceeding the standard frequency transition.

8 Claims, 5 Drawing Sheets

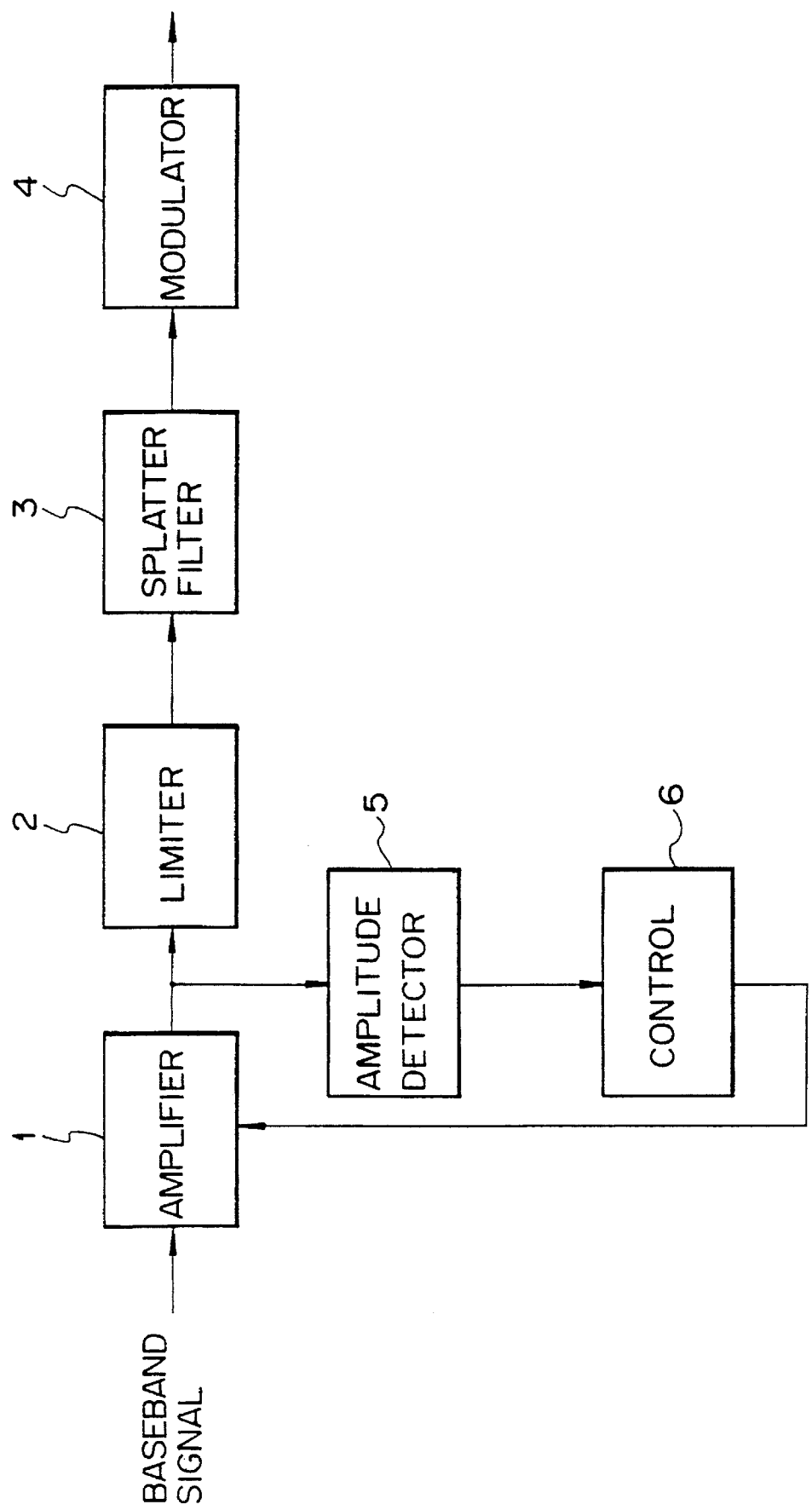

BASEBAND SIGNAL PROCESSING CIRCUIT FOR A RADIO COMMUNICATION APPARATUS

This is a Continuation of application Ser. No. 07/816,399 filed on Dec. 27, 1991, now abandoned.

BACKGROUND OF THE INVENTION

The present invention relates to a radio communication apparatus and, more particularly, to an improved baseband signal processing circuit including an amplifier and a limiter.

A conventional baseband signal processing circuit has an amplifier for level adjustment, a limiter, a splatter filter, and a modulator. The amplifier amplifies an input baseband signal and feeds the resulting signal to the limiter. The limiter limits the amplitude of the amplified baseband signal to prevent the frequency band from broadening in the event of transmission or, in the case of FM, limits the deviation. On receiving the output of the limiter, the splatter filter removes the frequency band for broadband from the limiter output. The output of the splatter filter is applied to the modulator.

In the conventional circuit described above, when the input signal to the limiter has an extremely great amplitude (infinite), the output of the limiter has a rectangular waveform whose amplitude has been limited at a predetermined level. The splatter filter removes, among the frequency components of the rectangular wave, high frequency components. However, when only the fundamental frequency component of the frequency of the rectangular wave is passed through the splatter filter, the output of the filter has a greater amplitude than the rectangular wave. Specifically, the amplitude is $4/\pi$ times greater than the amplitude of the rectangular wave. More specifically, at the stage following the splatter filter, the amplitude is $4/\pi$ times greater in the frequency range in which only the fundamental frequency component passes than in the frequency range in which all the frequency components pass, despite that the limiter limits the amplitude. Regarding an FM (Frequency Modulation) transmitter, the limiter limits the maximum frequency transition. However, the maximum frequency transition has to be further reduced in the frequency range in which the output amplitude of the splatter filter is 1, since it should be limited with $4/\pi$ used as a reference. This reduces the difference between the standard and maximum frequency transitions and, therefore, is apt to cause distortion to occur at signal levels exceeding the standard frequency transition.

SUMMARY OF THE INVENTION

It is, therefore, an object of the present invention to provide a baseband signal processing circuit for a radio communication apparatus which allows the maximum frequency transition to be set up with no regard to frequency and reduces distortion even when the signal exceeds the standard frequency distortion.

In accordance with the present invention, a baseband processing circuit for a radio communication apparatus includes an amplifier for amplifying the amplitude of an input baseband signal to thereby produce an amplified baseband signal, a limiter for limiting the amplitude of the amplified baseband signal, an amplitude detector for detecting the amplitude of the amplified baseband signal to thereby output a detection signal, and a control unit responsive to the detection signal for controlling, when the amplitude detector detects an amplitude greater than a predetermined amplitude, the gain of the amplifier such that the output of the amplifier remains at a constant level.

Also, in accordance with the present invention, a baseband signal processing method for a radio communication apparatus includes the steps of, amplifying the amplitude of an input baseband signal to produce an amplified baseband signal, limiting the amplitude of the amplified baseband signal, detecting the amplitude of the amplified baseband signal to produce a detection signal, and controlling, when an amplitude greater than a predetermined amplitude is detected, the gain of the amplified baseband signal such that the amplified baseband signal remains at a predetermined level.

BRIEF DESCRIPTION OF THE DRAWINGS

The above and other objects, features and advantages of the present invention will become more apparent from the following detailed description taken with the accompanying drawings in which:

FIG. 3 is a block diagram schematically showing a baseband signal processing circuit embodying the present invention;

DESCRIPTION OF THE PREFERRED EMBODIMENT

Figure 1:
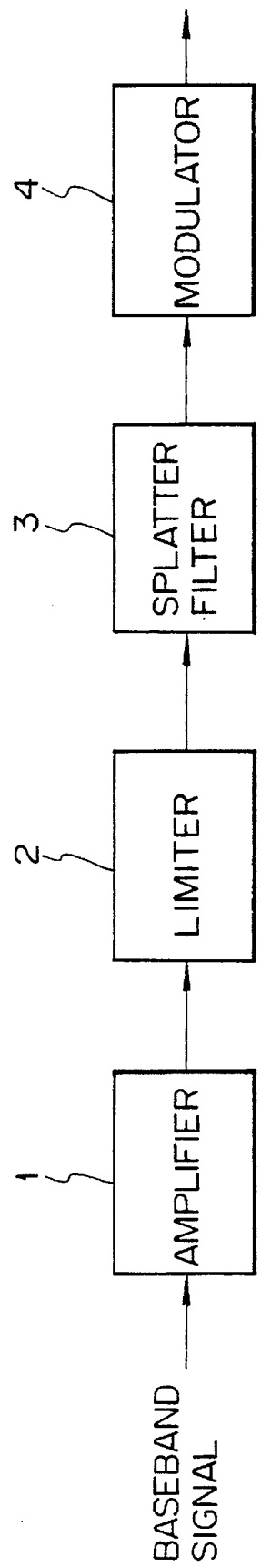
FIG. 1 is a block diagram schematically showing a conventional baseband signal processing circuit for a radio communication apparatus.

To better understand the present invention, a brief reference will be made to a prior art baseband signal processing circuit for transmission, shown in FIG. 1. As shown, the processing circuit has an amplifier 1 for level adjustment, a limiter 2, a splatter filter 3, and a modulator 4. The amplifier 1 amplifies an input baseband signal and feeds the resulting signal to the limiter 2. The limiter 2 limits the amplitude of the amplified baseband signal to prevent the frequency band from broadening in the event of transmission or, in the case of FM, limits the deviation. On receiving the output of the limiter 2, the splatter filter 3 removes the frequency band for broadband from the limiter output. The output of the splatter filter 3 is applied to the modulator 4.

Figure 2A:
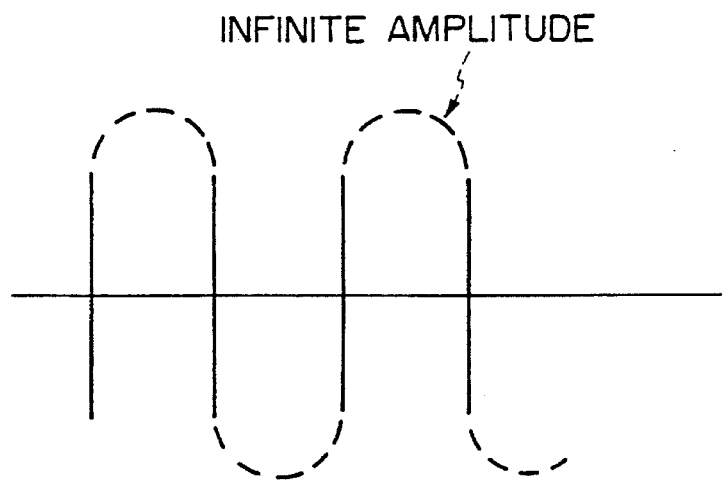
FIGS. 2A–2C show signal waveforms representative of the operation of the conventional processing circuit.
Figure 2B:
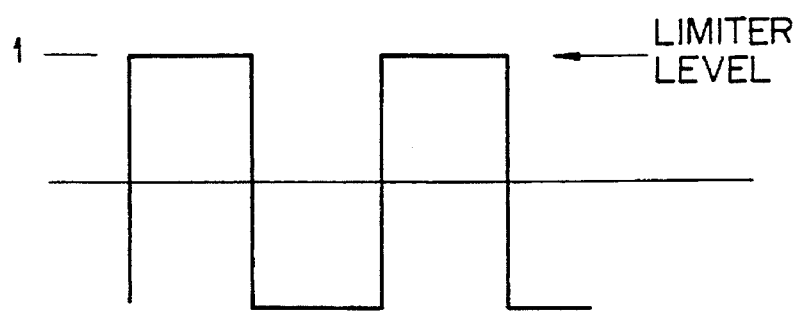

In the above construction, when the input signal to the limiter 2 has an extremely great amplitude (infinite), the output of the limiter 2 has a rectangular waveform. Specifically, when the limiter 2 limits an input signal having an extremely great amplitude as shown in FIG. 2A, it produces an output having a rectangular waveform whose amplitude has been limited at a predetermined level, as shown in FIG. 2B. The splatter filter 3 removes, among the frequency components of the rectangular wave, high frequency components. However, when only the fundamental frequency component of the frequency f of the rectangular wave is passed through the splatter filter 3, the output of the filter 3 has a greater amplitude than the rectangular wave. Specifically, when the rectangular wave shown in FIG. 2B is subjected to Fourier transform, the result is expressed as:

$$f(x) = \frac{4}{\pi} \left[ \sin x + \frac{\sin 3x}{3} + \frac{\sin 5x}{5} + \ldots \right]$$

Hence, after the rectangular wave is passed through a filter which passes only the fundamental frequency component, the following equation holds:

$$f(x) = \frac{4}{\pi} \cdot \sin x$$

Figure 2C:
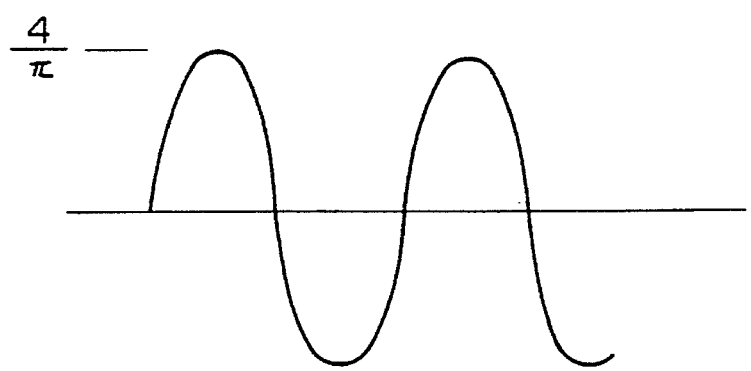

As a result, the amplitude is $4/\pi$ times greater than the amplitude of the rectangular wave. Such a waveform is shown in FIG. 2C.

The above-described conventional processing circuit is disadvantageous in that the amplitude of the output of the limiter 2 changes with the signal frequency, and in that distortion is apt to occur at signal levels exceeding the standard frequency transition.

Referring to FIG. 3, a baseband signal processing circuit embodying the present invention and free from the above-discussed problems will be described. In the figures, the same or similar components are designated by the same reference numerals, and redundant description will be avoided for simplicity. As shown, the processing circuit has an amplifier 1 for amplifying a baseband signal to be transmitted. A limiter 2 limits the amplitude of the output of the amplifier 1. The output of the limiter 3 is routed through a splatter filter 3 to a modulator 4. This part of the construction is identical with the conventional arrangement. The processing circuit further includes an amplitude detector 5 for detecting the amplitude of the output of the amplifier 1, and a control unit 6 for controlling the gain of the amplifier 1 in response to the output of the amplitude detector 5.

Figure 4:
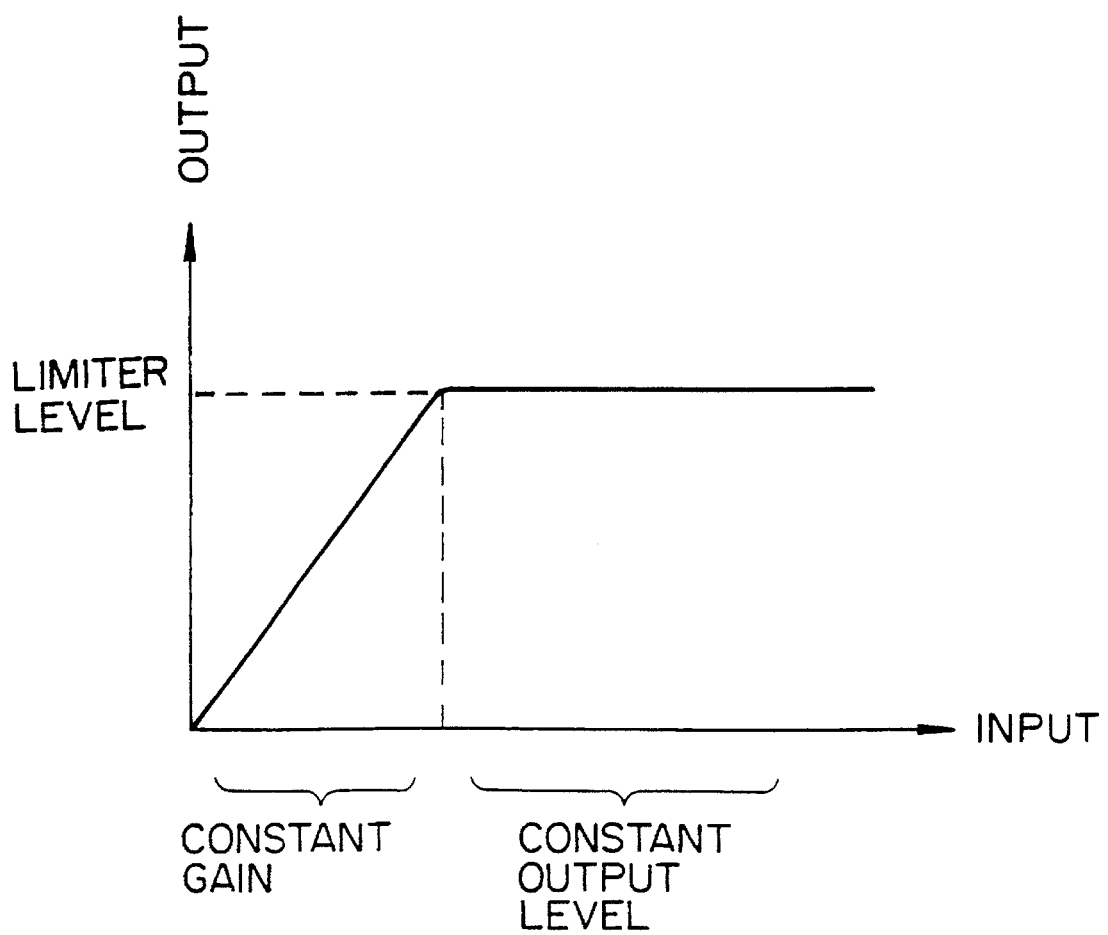
FIG. 4 is a graph useful for understanding the operation of the embodiment.

In operation, when the output level of the amplifier 1, i.e., the level of the input signal to the limiter 2 is lower than the limiter level, the control unit 6 does not effect any control over the amplifier 1. On the other hand, when the input signal to the limiter 2 has a higher level than the limiter level, the control unit 6 controls the amplifier 1 such that the output level of the amplifier 1, i.e., the limiter input level, remains constant. More specifically, the control unit 6 controls the gain of the amplifier 1 in response to the output of the amplitude detector 5 such that the input and output of the amplifier 1 have a relation shown in FIG. 4. As a result, the output of the amplifier 1 remains constant even when a signal having a great amplitude is inputted to the amplifier 1, substantially preventing signals having higher levels than the limiter level from reaching the limiter 2. This prevents the limiter 2 from producing a rectangular wave and, therefore, prevents the amplitude level of the output of the splatter filter 3 from exceeding that of the input to the filter 3. It follows that controlling the maximum frequency transition of an FM transmitter to below the input level of a splatter filter as discussed earlier is not necessary. This is successful in eliminating distortions at levels above the standard frequency transition.

Figure 5:
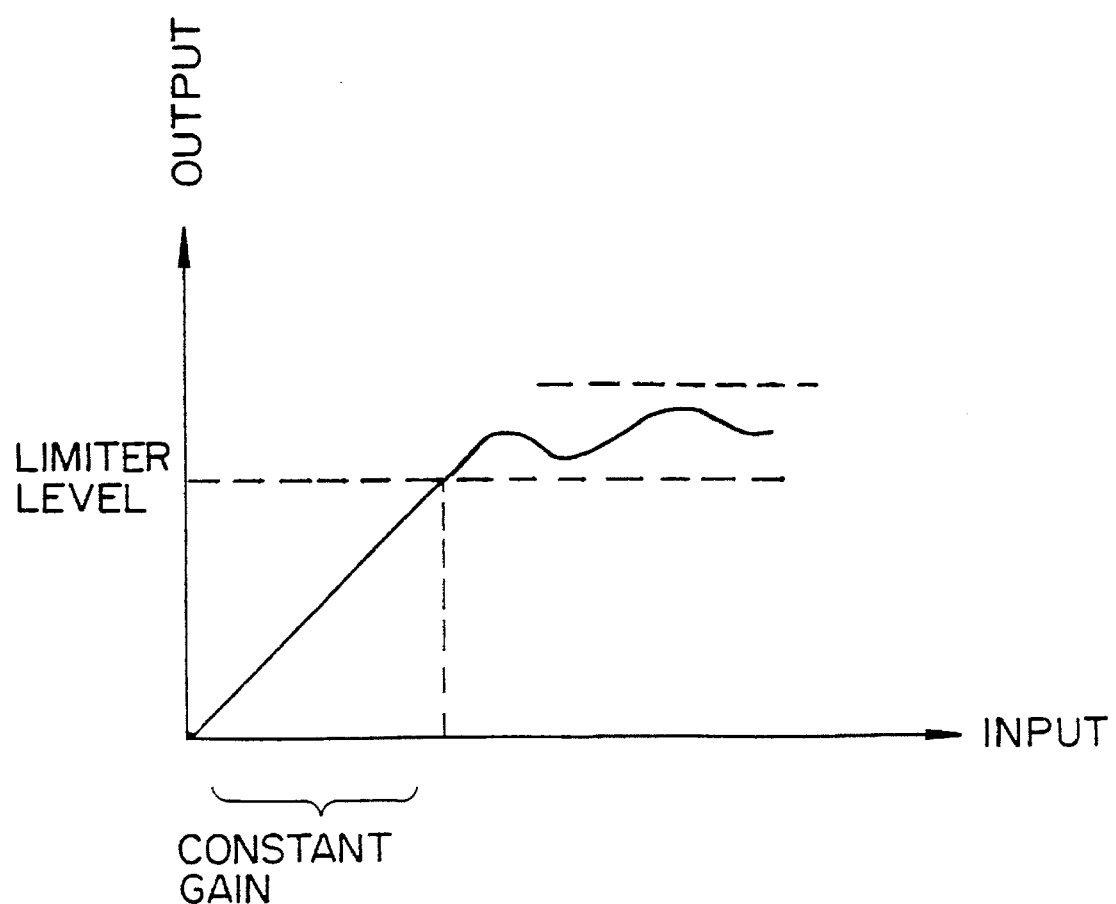
FIG. 5 is a graph showing the operation of and alternative embodiment.

It is to be noted that the limiter 2 is also essential when a level exceeding the range wherein the output level of the amplifier 1 can be maintained constant, so that the amplitude level may be limited. While the disclosed embodiment lowers the output level of the amplifier 1 to the limiter level, the limiter level may alternatively be replaced with a level, as seen in FIG. 5, slightly higher than the limiter level so long as the high frequency components of the limiter output are not great.

In summary, it will be seen that the present invention provides a baseband signal processing circuit which suppresses the level of higher harmonics included in the output of a limiter and thereby prevents the amplitude from increasing at a stage subsequent to a splatter filter. This unprecedented advantage is derived from the fact that the processing circuit detects the amplitude of the output of an amplifier and controls the amplifier such that the output level of the amplifier does not exceed the limiter level. The present invention, therefore, allows the maximum frequency transition to be set up with no regard to frequency and insures a sufficient distortion factor for signals exceeding the standard frequency transition.

Various modifications will become possible for those skilled in the art after receiving the teachings of the present disclosure without departing from the scope thereof.

What is claimed is:

1. A baseband processing circuit for a radio communication apparatus, comprising:

an amplifier for amplifying an amplitude of an input baseband signal to thereby produce an amplified baseband signal;

a limiter for limiting the amplitude of said amplified baseband signal to a limiter level;

a splatter filter for receiving and filtering the output of said limiter;

a modulator for receiving the output of said splatter filter;

an amplitude detector for detecting the amplitude of said amplified baseband signal to thereby output a detection signal; and a control unit responsive to said detection signal for controlling the gain of said amplifier to cause the amplified signal output from said amplifier to remain at or lower than a predetermined level, said predetermined level being higher than the limiter level, when the amplitude detector detects that the amplified signal output from said amplifier has an amplitude greater than the predetermined level, thereby substantially preventing the output amplitude of the splatter filter from exceeding the input amplitude of the splatter filter.

2. A baseband signal processing method for a radio communication apparatus, comprising the steps of:

(a) amplifying the amplitude of an input baseband signal to produce an amplified baseband signal;

(b) detecting the amplitude of said amplified baseband signal to produce a detection signal;

(c) controlling, when an amplitude greater than a predetermined level is detected in step (b), the gain of said amplified baseband signal in response to said detection signal to cause said amplified baseband signal to remain at or below said predetermined level, said predetermined level being above a limiter level;

(d) limiting the amplitude of the amplified baseband signal with a limiter having said limiter level;

(e) supplying the output of the limiter to a splatter filter; and (f) supplying the output of the splatter filter to a modulator, thereby substantially preventing the output amplitude of the splatter filter from exceeding the input amplitude of the splatter filter.

3. A baseband processing circuit for a radio communication apparatus, comprising:

an amplifier for amplifying an amplitude of an input baseband signal to thereby produce an amplified baseband signal;

a limiter for limiting the amplitude of said amplified baseband signal to a limiter level;

a splatter filter for receiving and filtering the output of said limiter;

a modulator for receiving the output of said splatter filter;

an amplitude detector for detecting the amplitude of said amplified baseband signal to thereby output a detection signal; and a control unit responsive to said detection signal for controlling, when said amplitude detector detects an amplitude greater than a predetermined amplitude, the gain of said amplifier to cause the amplified signal output from said amplifier to remain at a constant level no greater than said predetermined amplitude, said predetermined amplitude being above said limiter level, thereby substantially preventing the output amplitude of the splatter filter from exceeding the input amplitude of the splatter filter.

4. A method for processing a baseband signal, comprising the steps of:

(a) amplifying the amplitude of an input baseband signal to produce an amplified baseband signal;

(b) detecting the amplitude of said amplified baseband signal to produce a detection signal;

(c) controlling, when an amplitude greater than a predetermined level is detected in step (b), the gain of said amplified baseband signal in response to said detection signal to cause said amplified baseband signal to remain no greater than said predetermined level, said predetermined level being above a limiter level;

(d) limiting the amplitude of said amplified baseband signal with a limiter having said limiter level;

(e) supplying the output of the limiter to a splatter filter; and (f) supplying the output of the splatter filter to a modulator, thereby substantially preventing the output amplitude of the splatter filter from exceeding the input amplitude of the splatter filter.

5. A baseband processing circuit for a radio communication apparatus, comprising:

an amplifier for amplifying an amplitude of an input baseband signal to thereby produce an amplified baseband signal;

a limiter for limiting the amplitude of said amplified baseband signal to a limiter level;

a splatter filter for receiving and filtering the output of said limiter;

a modulator for receiving the output of said splatter filter;

an amplitude detector for detecting the amplitude of said amplified baseband signal to thereby output a detection signal; and a control unit responsive to said detection signal for controlling the gain of said amplifier to cause the amplified signal output from said amplifier to remain at or lower than the limiter level, when the amplitude detector detects that the amplified signal output from said amplifier has an amplitude greater than the limiter level, thereby substantially preventing the output amplitude of the splatter filter from exceeding the input amplitude of the splatter filter.

6. A baseband signal processing method for a radio communication apparatus, comprising the steps of:

(a) amplifying the amplitude of an input baseband signal to produce an amplified baseband signal;

(b) detecting the amplitude of said amplified baseband signal to produce a detection signal;

(c) controlling, when an amplitude greater than a limiter level is detected in step (b), the gain of said amplified baseband signal in response to said detection signal to cause said amplified baseband signal to remain at or below said limiter level;

(d) limiting the amplitude of the amplified baseband signal with a limiter having said limiter level;

(e) supplying the output of the limiter to a splatter filter; and (f) supplying the output of the splatter filter of a modulator, thereby substantially preventing the output amplitude of the splatter filter from exceeding the input amplitude of the splatter filter.

7. A baseband processing circuit for a radio communication apparatus, comprising:

an amplifier for amplifying an amplitude of an input baseband signal to thereby produce an amplified baseband signal;

a limiter for limiting the amplitude or said amplified baseband signal to a limiter level;

a splatter filter for receiving and filtering the output of said limiter;

a modulator for receiving the output of said splatter filter:

an amplitude detector for detecting the amplitude of said amplified baseband signal to thereby output a detection signal; and a control unit responsive to said detection signal for controlling, when said amplitude detector detects an amplitude greater than the limiter level, the gain of said amplifier to cause the amplified signal output from said amplifier to remain at a constant level no greater than said limiter level, thereby substantially preventing the output amplitude of the splatter filter from exceeding the input amplitude of the splatter filter.

8. A method for processing a baseband signal, comprising the steps of:

(a) amplifying the amplitude of an input baseband signal to produce an amplified baseband signal;

(b) detecting the amplitude of said amplified baseband signal to produce a detection signal;

(c) controlling, when an amplitude greater than a limiter level is detected in step (b), the gain of said amplified baseband signal in response to said detection signal to cause said amplified baseband signal to remain no greater than said limiter level:

(d) limiting the amplitude of said amplified baseband signal with a limiter having said limiter level;

(e) supplying the output of the limiter to a splatter filter: and (f) supplying the output of the splatter filter to a modulator, thereby substantially preventing the output amplitude of the splatter filter from exceeding the input amplitude of the splatter filter.

* * * * *